United States Patent [19]

Hallenbeck et al.

[11] Patent Number: 4,761,647

[45] Date of Patent: Aug. 2, 1988

[54] EPROM CONTROLLED TRI-PORT TRANSCEIVER

[75] Inventors: Kirby S. Hallenbeck, Shingle Springs; Lawrence S. Palley, Orangevale, both of Calif.

[73] Assignee: Intel Corporation, Santa Clara, Calif.

[21] Appl. No.: 34,846

[22] Filed: Apr. 6, 1987

[51] Int. Cl.$^4$ .......................... H04Q 11/04; H04J 3/04
[52] U.S. Cl. ............................... 340/825.220; 375/10; 340/825.030; 370/58
[58] Field of Search ..................... 340/825.22, 825.83, 340/825.02, 825.03; 375/7, 10, 8, 121; 370/32, 112, 60, 58; 307/465, 243; 455/78

[56] References Cited

U.S. PATENT DOCUMENTS

| | | | |
|---|---|---|---|
| 3,952,212 | 4/1976 | Matsumoto et al. | 307/243 |
| 4,609,986 | 9/1986 | Hartmann et al. | 364/200 |
| 4,617,479 | 10/1986 | Hartmann et al. | 307/465 |
| 4,646,286 | 2/1987 | Reid et al. | 340/825.01 |
| 4,723,120 | 2/1988 | Petty, Jr. | 375/10 |
| 4,725,835 | 2/1988 | Schreiner et al. | 340/825.83 |
| 4,726,015 | 2/1988 | Nirschl | 370/112 |

Primary Examiner—Donald J. Yusko
Attorney, Agent, or Firm—Blakely, Sokoloff, Taylor & Zafman

[57] ABSTRACT

A tri-port transceiver for receiving, switching and transmitting digital information among its ports. An input to each port is coupled to a multiplexer of each other port, wherein the multiplexer of each other port, wherein the multiplexers provide the switching of signals onto other ports. A buffer and a latch are used to couple each input port signal to the multiplexers, and a driver coupled to the multiplexer provides transmission of the selected signal from the multiplexer. An EPROM based PLA operates as a programmable state machine to generate control signals to the tri-port transceiver. In one embodiment, a programmable output impedance driver is used.

22 Claims, 3 Drawing Sheets

4,761,647

EPROM CONTROLLED TRI-PORT TRANSCEIVER

BACKGROUND OF THE INVENTION

1. Field of the Invention

The present invention relates to the field of erasable programable logic devices and more specifically to data switching networks under the control of EPROM PALs.

2. The manufacture and use of electrically programmable read-only memories (EPROMs) are a well-known technology in the prior art. Recently, EPROM devices have been combined with programmable logic arrays (PLAs) and have provided a new advancement in the area of erasable programmable logic devices (EPLD). A typical EPLD array architecture is disclosed in two U.S. patents to Hartmann et al., U.S. Pat. Nos. 4,609,986 and 4,617,479. Such array architecture utilizes a plurality of EPROM cells which are arranged in a row and column matrix structure. Typically, output of the columns of an array are inputted into a macro architecture circuit for further dynamic processing of the outputs of the memory cells.

Also in the prior art, switching networks to transfer data from one communication line onto another communication line are well-known. Some of these switching networks incorporate drivers such that data on one line is transferred onto another line with the signal being boosted or amplified to provide the drive to transmit the signal onto the second line. In effect, a basic transceiver with a switching network for switching signals from one line to another is available in the prior art.

Although various forms of PLAs and transceiver/switching networks are known in the prior art, it is a different matter to combine the two technologies to provide a highly programmable and compact device which is economically implemented in a single semiconductor chip. By implementing an erasable programmable logic device to control a multi-port transceiver unit, a highly sophisticated data switching/transceiver unit is made to be controlled under control signals from the PLA. Further, by using PLAs, the signals from the transceiver unit can be fed back to the array to provide feedback signals for dynamic programming of the memory array. By implementing both structures as a combination, considerable space savings is possible and the complete unit can be economically implemented on a single semiconductor chip.

It is appreciated that what is needed is an improved device for manipulating signals onto various communication lines, wherein such manipulation is under the control of a dynamic programmable logic array.

SUMMARY OF THE INVENTION

The present invention describes a tri-port transceiver which is dynamically controlled by an erasable programmable logic array (PLA) wherein the PLA is implemented using EPROM. The tri-port transceiver is coupled to receive, switch and transmit data among its three ports. Control functions are determined by the control state machine of the PLA and the PLA provides control signals to operate the transceiver.

An input section of each port couples its input signal through a buffer and a latch. An output section of each port includes a multiplexer coupled to receive input signals from the latches of the other two ports and selects one of these other input signals. The selected signal is coupled to a driver which, when activated, will transmit the other selected port signal onto its port.

A second multiplexer for each port also provides an inverted and non-inverted signal selection in the output section. A third multiplexer is also available for the selection of latched and unlatched input signals. A feedback multiplexer selects one of the input signals as feedback to the PLA for next state generation from the PLA.

The driver used to drive the output of each port is a three-state driver. In one alternative embodiment, at least one of these output drivers has its output impedance controlled by a programming signal.

DETAILED DESCRIPTION OF THE PRESENT INVENTION

A multiple-port transceiver which is dynamically controlled by signals from a programmable logic array is described. In the following description, numerous specific details are set forth, such as a specific EPROM PLA architecture, specific circuit components, etc., in order to provide a thorough understanding of the present invention. It will be obvious, however, to one skilled in the art that the present invention may be practiced without these specific details. In other instances, well-known circuits have not been described in detail in order not to unnecessarily obscure the present invention. Further, although the preferred embodiment is described in conjunction with a particular EPROM PLA, it is evident to those skilled in the art that the present invention can be practiced with other devices which use erasable programmable logic array devices.

Figure 1:
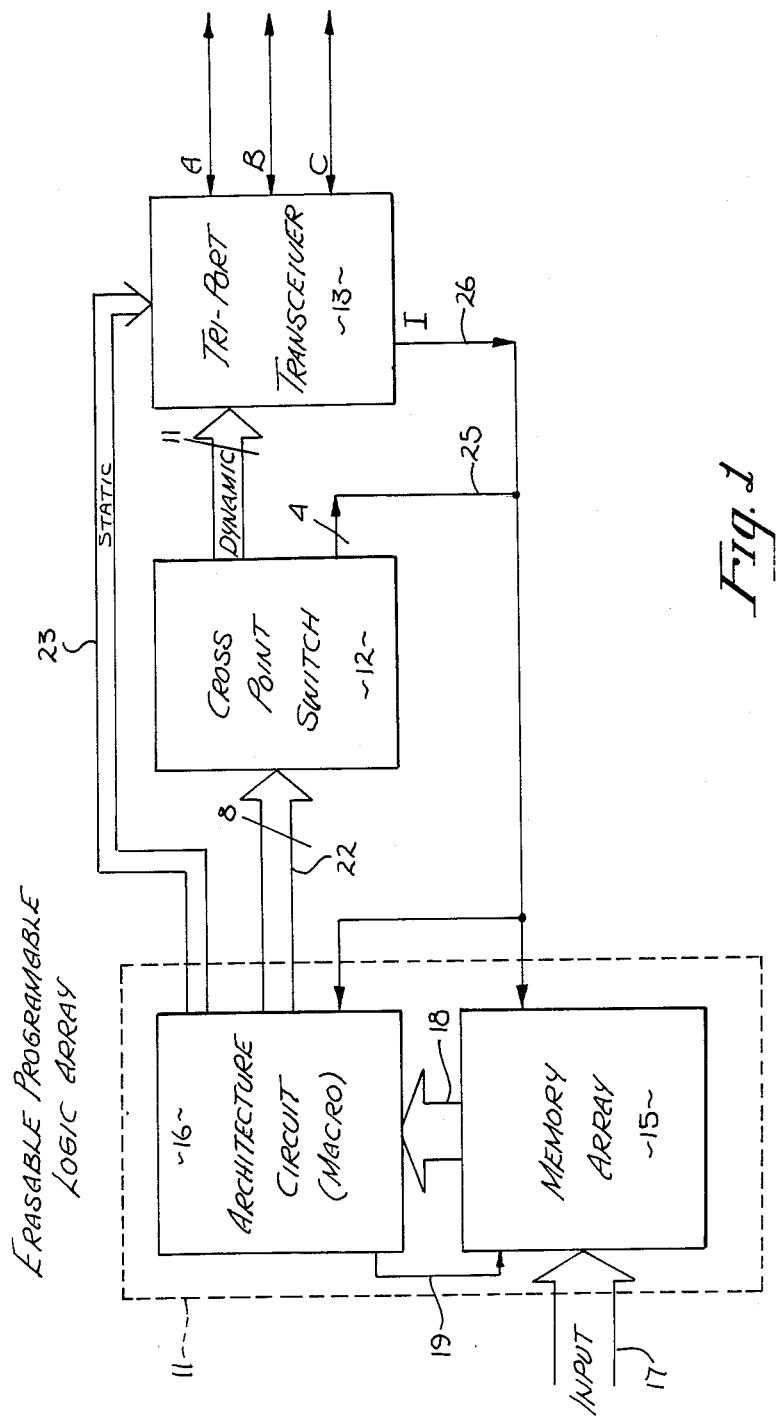
FIG. 1 is a block diagram schematic of the present invention showing a programmable logic array, crosspoint switch and a tri-port transceiver.

Referring to FIG. 1, a block diagram of the present invention is shown. The present invention is comprised of an erasable programmable logic array 11, crosspoint switch 12 and tri-port transceiver 13. The array 11, shown as a dotted line, includes memory array 15 and macro architecture circuit 16. Memory array 15 is comprised of memory cells formed into a row and column matrix structure. Input signals 17 to memory array 15 select the various rows of the memory array matrix and decoder circuits (not shown) within array 11 select the various columns of the memory array 15. The output 18 of the memory array is coupled to the architecture circuit 16, wherein these outputs are processed by the architecture circuit 16.

Various other features, such as decoders, sensing amplifiers, macro-cell circuits within architecture circuit 16, as well as other flip-flops and multiplexers, are not shown in order not to complicate the understanding of the present invention. Basically, array 11 is a control state machine responsive to inputs 17. The array 11 of the present invention utilizes a PLA implemented using EPROM technology, and the workings of such an array are disclosed in the Hartmann et al. U.S. Pat. Nos.

(4,609,986 and 4,617,479) references disclosed earlier. Architecture circuit 16 also provides various feedback signals on line 19 which are fed back to the input of memory array 15 for determining a next state condition from memory array 15.

Architecture circuit outputs of PLA 11 are coupled to crosspoint switch 12 on bus 22 and directly coupled to tri-port transceiver 13 on bus 23. In the preferred embodiment, bus 22 is an 8-bit bus. The 8-bit signal on bus 22 is utilized by the crosspoint switch 12 to generate an 11-bit signal on bus 24 and a 4-bit feedback signal on line 25 (Line 25 is actually comprised of a plurality of lines but is shown singly). Crosspoint switch 12 is basically a multiplexer for converting 8 bits to 15 bits. Although the 8 bits on bus 22 can be coupled directly to tri-port transceiver 13 without the use of crosspoint switch 12, the preferred embodiment uses crosspoint switch 12 to generate 15 bits from an 8-bit input. Use of prior art circuits to provide the function of bit conversion from a state machine are well-known in the technology.

Bus 24 provides dynamic signals to transceiver 13. These signals are labeled dynamic, because they typically will change with the state changes of PLA 11. Bus 23 from PLA 11 provides static signals to transceiver 13. These signals are labelled static, because once set they will normally remain unchanged. Signals on line 25 are coupled back to PLA 11 to provide feedback for the generation of the next state from PLA 11.

Tri-port transceiver 13 receives dynamic signals on bus 24 and static signals on bus 23 as control signals from PLA 11. Transceiver 13 is also coupled to a plurality of channels A, B and C. Transceiver 13 is capable of receiving data signals on any one of these channels A, B and C and switch data from any one of these channels onto any or all other channels. For example, information on channel A is received by transceiver 13 and is switched onto either channel B, C or both B and C. Further, transceiver 13 is capable of placing any one of the channel signals onto internal channel I (shown as line 26) for feedback to PLA 11. The switching of the various channels is controlled by static and dynamic signals from PLA 11. Although only three ports are shown coupled to transceiver 13, the actual number of channels is arbitrary and is left to the choice of the designer.

Functionally, control signals for transceiver 13 can be provided from various other sources, such as CPUs, other state machines, and other memory units besides EPROMs. However, it is the intention of the present invention to implement the tri-port transceiver as an EPLD using EPROM technology to provide the various control signals for activating transceiver 13. Also, the EPLD of the present invention as shown in FIG. 1 is manufactured on a single semiconductor chip.

Figure 2:
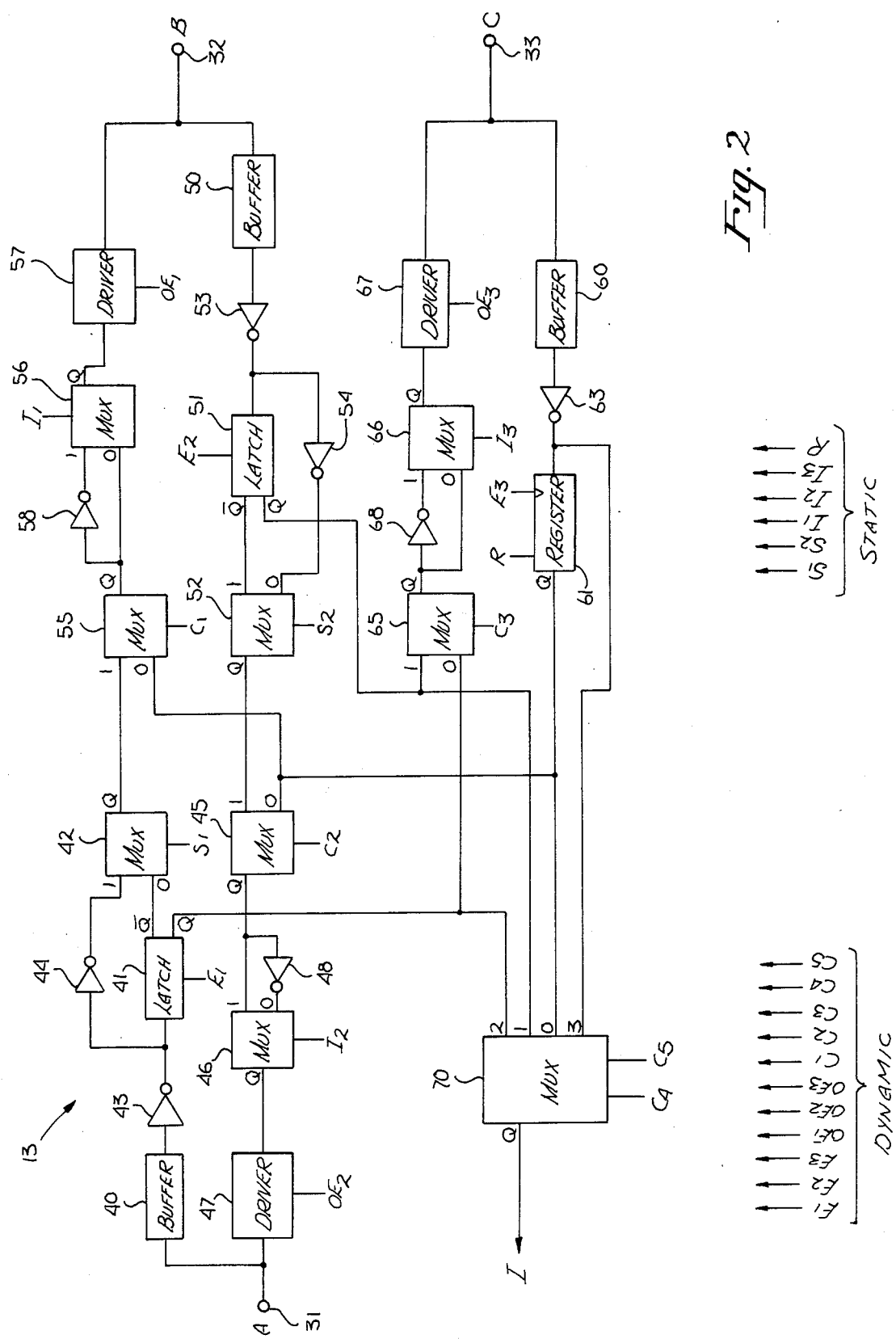
FIG. 2 is a schematic diagram of the tri-port transceiver of FIG. 1.

Referring to FIG. 2, transceiver 13 of FIG. 1 is shown in circuit schematic form. Channels A, B and C are shown coupled to transceiver 13 at terminals 31, 32 and 33, respectively. The various dynamic and static signals of FIG. 1 are shown at the bottom of the drawing as eleven dynamic signals and six static signals. It is appreciated that the number of the various dynamic and static signals are arbitrary and, further, it is readily apparent that all of these signals can be implemented as dynamic signals.

The input section of channel A is comprised of buffer 40, latch 41, multiplexer (MUX) 42 and inverters 43 and 44. Terminal 31 is coupled to the input of buffer 40 and the output of buffer 40 is coupled to inverter 43. The output of inverter 43 is coupled to inverter 44 and to the input of latch 41. The output of inverter 44 is coupled to one input of MUX 42 and the inverted output of latch 41 is coupled to a second input of MUX 42.

The input circuit for channel B is equivalently structured, wherein terminal 32 is coupled to the input of buffer 50 and the output of buffer 50 is coupled to inverter 53. The output of inverter 53 is coupled to the input of latch 51 and inverter 54. The inverted output of latch 51 is coupled to one input of MUX 52 and the output of inverter 54 is coupled to a second input of MUX 52.

Although a similar input circuit can be used for channel C, an alternative embodiment of an input circuit is actually utilized for the input circuit of channel C. Terminal 33 is coupled to the input of buffer 60 and the output of buffer 60 is coupled to inverter 63. The output of inverter 63 is coupled to the input of latch register 61. The output from latches 41, 51 and 61 are each coupled as an input to MUX 70. Output of inverter 63 is also coupled to a fourth input of MUX 70 as an unlatched channel C signal.

The output section of each of the channels are structured equivalently to provide the switching and driving circuits necessary for transceiver 13. The channel A selection MUX 45 has as its inputs the output of MUX 52 and the non-inverted output of latch 61. The output of MUX 45 is coupled to one input of MUX 46 and to inverter 48. The output of inverter 48 is coupled as a second input to MUX 46. The output of MUX 46 is coupled to the input of driver 47 and the output of driver 47 is coupled to terminal 31.

For channel B, a selection MUX 55 has as its input the output of MUX 42 and the non-inverted output of latch 61. The output of MUX 55 is coupled to one input of MUX 56 and to inverter 58. The output of inverter 58 is coupled to a second input of MUX 56. The output of MUX 56 is coupled to the input of driver 57 and the output of driver 57 is coupled to terminal 32.

Equivalently, channel C selection MUX 65 has as its inputs the non-inverted output of latch 41 and latch 51. The output of MUX 65 is coupled to one input of MUX 66 and to inverter 68. The output of inverter 68 is coupled to a second input of MUX 66. The output of MUX 66 is coupled to the input of driver 67 and the output of driver 67 is coupled to terminal 33.

Various control signals shown as dynamic and static signals (shown at the bottom of the drawing) are coupled to various components of the transceiver circuit 13 as shown on the drawing. As stated earlier, the static signals are labeled as such, because the state of the signals normally remain unchanged during data transfer. The dynamic signals will normally change their states during data transfer. Although a specific static and dynamic control signal differentiation is made, such differentiation is arbitrary as all of these control signals can be lumped into one category of control signals.

Functionally, data on channels A, B and C are inputted at terminals 31, 32 and 33, respectively, and are latched into its respective latches 41, 51 and 61, respectively. Buffers 40, 50 and 60 buffer the input signal and inverters 43, 53 and 63 invert the buffered signal.

For channel A, the output of inverter 43 is passed onto MUX 42 through another inverter 44 or through latch 41. Control signal $E_1$ enables latch 41 to pass the output of inverter 43. MUX 42, by the state of a control signal $S_1$, will select either the output of inverter 44 or the latched output of latch 41. Therefore, the output of MUX 42 is either an unlatched or a latched version of the signal present on channel A. Equivalently, channel B input is coupled through buffer 50 and inverter 53. A control signal $E_2$ latches the input information through to MUX 52. Control signal $S_2$ controls the selection of either a latched or an unlatched version of the signal present on channel B by selecting either the output of inverter 54 on the output of latch 51. For channel C, latch register 61 is controlled by a static enable signal R and clocked by a dynamic signal $E_3$.

The output of latch 61 and the output of MUX 42 are coupled to MUX 55, such that control signal $C_1$ selects between the output of register 61 or MUX 42. Static control signal $I_1$ controls MUX 56, wherein MUX 56 selects either the inverted or the non-inverted output of MUX 55. Driver 57 is activated by control signal $OE_1$, such that an output from the driver 57 occurs only when signal $OE_1$ activates driver 57. Typically, driver 57 will be a tri-state driver, such that the output of driver 57 is in a high-impedance state when it is inactive so that driver 57 will not interfere with the operation of channel B when it is not active.

The output of MUX 52 is coupled to the input of MUX 45. Output of register 61 is also coupled to MUX 45, such that control signal $C_2$ selects between data from channel B and channel C. MUX 46 is controlled by control signal $I_2$, wherein control signal $I_2$ selects either the inverted or the non-inverted output of MUX 45. Control signal $OE_2$ is used to activate driver 47 for driving channel A. Driver 47 operates equivalently to that of driver 57 and is tri-stated to prevent interference of channel A.

The non-inverted output of latches 41 and 51 are coupled as input to MUX 65, wherein control signal $C_3$ selects between one of these two latched outputs, such that either channel A or channel B signal is selected. Control signal $I_3$ controls MUX 66 to select between an inverting or a non-inverting output of MUX 65. Control signal $OE_3$ activates driver 67 to drive channel C. Driver 67 is equivalent to that of driver 47 and 57, wherein it is a tri-state driver activated by signal $OE_3$. Outputs of latches 41, 51 and 61, as well as an unlatched channel C output of inverter 63, are coupled to MUX 70, wherein control signals $C_4$ and $C_5$ select one of these four inputs as output of MUX 70, which is then fed back on line 26 of FIG. 1 for internal use.

In operation, a signal present on channel A is transferred to channel B by taking a path through buffer 40, inverter 43, latch 41 or inverter 44, MUX 42, MUX 55, MUX 56 and driver 57. Either an unlatched or a latched version of the signal on channel A is passed depending on the selection of MUX 42. Further, the signal can be inverted or not inverted by the selection provided by MUX 56. For channel A to transfer information onto channel C, the output of latch 41 is passed onto MUX 65, and MUX 66 selects either a non-inverted or an inverted version of the signal present at the output of MUX 65.

Signals present on channel B are passed onto channel A by taking a path through buffer 50, inverter 53, latch 51 or inverter 54, MUX 52, MUX 45, MUX 46 and driver 47. MUX 52 selects either a latched or an unlatched version of the signal present on channel B, and MUX 46 selects either an inverted or a non-inverted version of that same signal. To transfer information from channel B to channel C, the output of latch 51 is coupled to MUX 65 and passed through MUX 66 and driver 67. MUX 66 selects either an inverted or a non-inverted output of MUX 65.

To transfer information form channel C to channel A, the output of latch 61 is passed to MUX 45, and then to MUX 46 and driver 47. Again, MUX 46 provides a selection of either an inverted or a non-inverted version of the signal on channel C. For channel C to transfer information to channel B, output of latch 61 is passed to MUX 55, and then to MUX 56 and driver 57. MUX 56 selects either an inverted or a non-inverted output of MUX 55. Again, the output of latches 41, 51 and 61, as well as the unlatched version of the signal of channel C, are coupled to MUX 70. Control signals $C_4$ and $C_5$ select one of these inputs as a feedback signal on channel I.

The driver circuits 47, 57 and 67 have been disclosed to be a tri-state driver, which is activated by the state of the signal present on control lines $OE_1$, $OE_2$ and $OE_3$, respectively. An alternative embodiment of the present invention provides for one, two or all three of these drivers to incorporate a driver having a variable impedance, such that additional control lines (not shown) coupled to these various driver circuits are capable of varying the output impedance of each of the output drivers. By controlling the impedance of drivers 47, 57 and 67, transceiver 13 can be coupled to various devices having differenct impedances, such that transceiver 13 will provide impedance matching for optimum signal transfer by varying the output impedance of drivers 47, 57 and 67 to match that of the impedance of devices coupled onto channels A, B and C.

The output of MUX 70, which is shown as channel I, is used to provide feedback signals to PLA 11 of FIG. 1. When certain state changes are detected, this information is fed back to the logic array 11, such that the control signals can be changed for next state generation of new signals from PLA 11. For example, one use of this scheme is to provide a signal on one channel, such as channel C for manipulating the transfer of data from channel A to channel B, or even to channel C.

Also, although FIG. 2 shows one preferred circuit for providing data transfer among channels A, B and C for serial data transfer, n number of these circuits can be replicated to provide n-bit parallel data transfers among the various ports. If parallel data transfers are being accomplished, then all of the dynamic and static signals can be obtained from a single macrocell 16 and provided to each of n-number of transceiver circuits. However, if independent bit manipulation is desired, then each of the n-number transceiver circuits will receive different control signals from a plurality of macrocells or from a plurality of crosspoint switches. The ultimate configuration is left to the choice of the designer.

Figure 3:
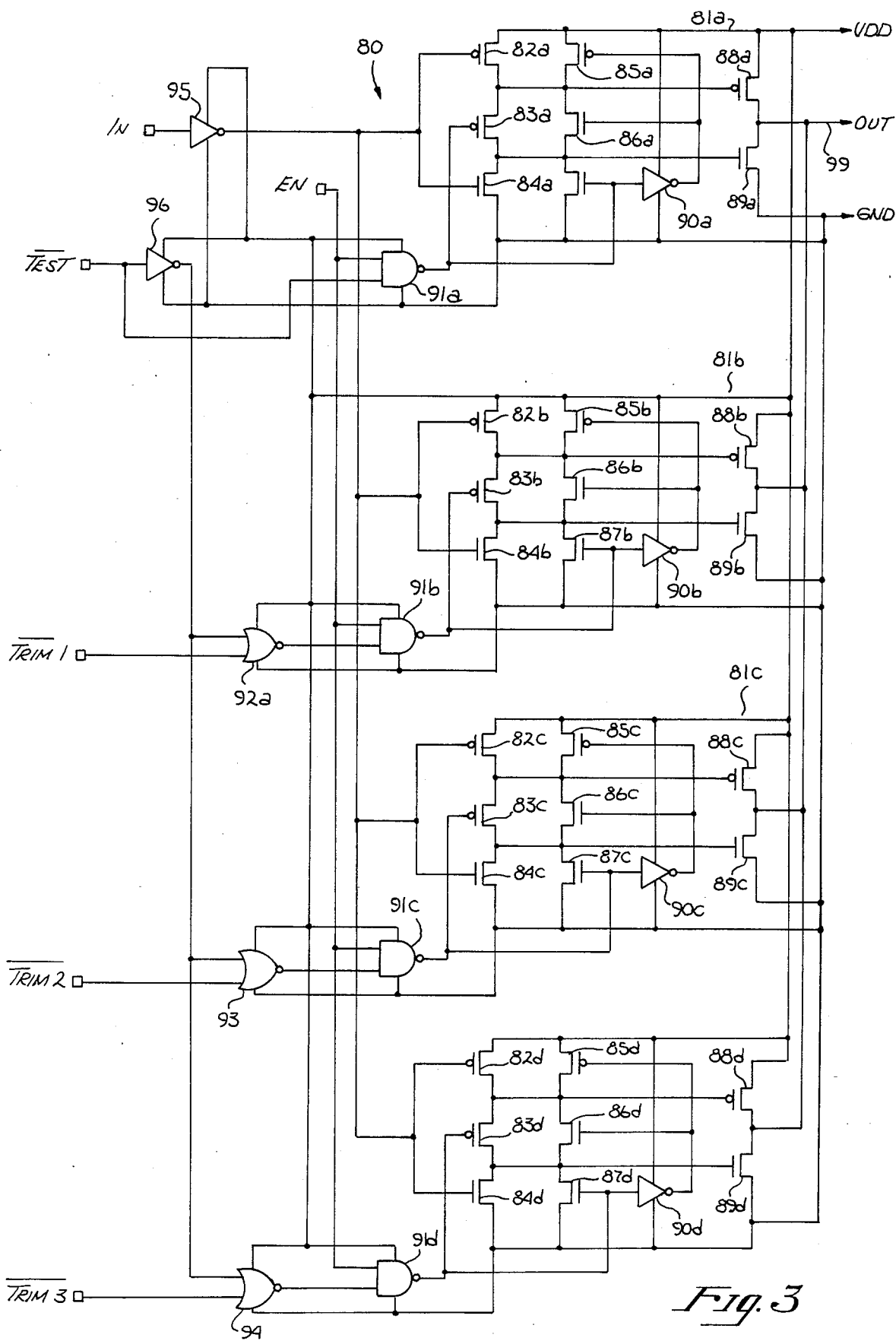
FIG. 3 is a schematic diagram of a programmable impedance driver which is used as an alternative embodiment of a driver circuit of the present invention.

Referring to FIG. 3, it shows an alternative embodiment of the driver circuits 47, 57, and 67 earlier mentioned. The alternative circuit 80 of FIG. 3 can be incorporated in place of any of the driver circuits 47, 57 and 67. However, additional control lines, which are not shown in FIG. 2, are needed to provide the programming signals to select the output impedance of driver circuit 80. The programmable impedance driver of circuit 80 is comprised of four equivalent driver sections which have their outputs coupled in parallel. Each of the driver sections 81a–d is comprised of transistors 82, 83 and 84 coupled in series between Vdd and ground, and transistors 85, 86 and 87 coupled in series between Vdd and ground and substantially in parallel to transistors 82, 83 and 84. Transistors 88 and 89 are also coupled in series between Vdd and ground; and the output of the driver is taken from the coupling of the two transistors 88 and 89. The description of circuit 80 references numerals 81-90, however, a reference letter a, b, c, and d are used as suffixes to the reference numerals in describing each circuit segment 81a–d, respectively, for the purpose of simplifying the explanation. For example, components 82a–90a are applicable to segment 81a and components 82b–90b are applicable to segment 81b, but description of references 82-91 apply equally to all sections 82a–d through 91a–d.

An input labeled In is equivalent to the driver input as shown in FIG. 2, and this input is coupled through inverter 95 to gates of transistors 82 and 84. An enable signal labeled EN, which is equivalent to the $OE_1$–$OE_3$ signal of FIG. 2 is coupled through NAND gate 91 to the gate of each of the respective transistors 83, 87 and to transistor 85 through inverter 90. Three trim signals labeled $\overline{TRIM\ 1}$, $\overline{TRIM\ 2}$, $\overline{TRIM\ 3}$ are coupled through NOR gates 92-94, respectively, and the output of NOR gates 92-94 are coupled as one input of NAND gates 91b–d, respectively.

In operation, circuit 80 is activated only when EN signal is present to enable circuit 80. When the enable signal has deactivated circuit 80, a high output at the output of NAND gate 91 causes transistors 85 and 87 to turn on to prevent transistors 88 and 89 from conducting and causing output line 99 to remain in a third state condition. When the enable signal is high, NAND gate 91 has a low output turning off transistors 85 and 87 and causing transistors 83 and 86 to turn on. The state of the input signal In determines if transistor 82 or 84 turns on, thereby latching the signal to activate either transistor 88 or 89; and causing the output line 99 to latch to either Vdd or ground.

Therefore, when circuit 80 is enabled, output line 99 would generate an output from circuit 81 wherein that output is dependent on the input signal to inverter 95. When segment 81a is in operation, output line 99 will have a given impedance dependent on the predetermined impedance value of the circuit segment 81a. Segment 81a is active whenever circuit 80 is activated by enabling signal EN. Circuit portions 81b–d function equivalently as 81a, however, the activation of each of the segments 81b–d is each controlled by trim signals $\overline{TRIM\ 1}$-$\overline{TRIM\ 3}$. Each of the trim signals and the enable signal EN are coupled to the input of NAND gates 91b through 91d, respectively, and permit the activation of segments 81b–d by programming signals $\overline{TRIM\ 1}$-$\overline{TRIM\ 3}$. Therefore, once circuit 80 is activated by an enable signal EN, circuit 81a is made operational, however, each of the trim signals $\overline{TRIM\ 1}$, $\overline{TRIM\ 2}$ and $\overline{TRIM\ 3}$, controls its appropriate segment 81b–d, respectively. If $\overline{TRIM\ 1}$ signal activates segment 81b then the input signal is also processed through segment 81b, wherein the output is the combination of segments 81a and 81b, such that the impedance of the output line 99 is equivalent to the parallel impedance of each of the segments 81a and 81b.

Accordingly, $\overline{TRIM\ 2}$ signal activates segment 81c and $\overline{TRIM\ 3}$ signal activates segment 81d wherein the addition of each of the segments 81c and d also contribute to the overall output impedance present on output line 99.

A test signal, $\overline{TEST}$ is coupled as an input to inverter 96 wherein the output of the inverter 96 is coupled as an input to each of the NOR gates 92b–d. The test signal is also coupled to the input of NAND gate 91a. The test signal is used in the preferred embodiment to deactivate segment 81a–d without relying on the other inputs to circuit 80. Although this test signal is implemented in the alternative embodiment, it is not crucial to the operation of the programming of the driver circuit 80. Further lesser number, as well as additional segments can be implemented to circuit 80 vary the impedance resolution available to programming.

Thus, a multiple-port transceiver/switching device utilizing EPROM PLA technology is disclosed.

We claim:

1. An erasable programmable logic device (EPLD) for receiving, switching and transmitting data among a plurality of channels, comprising:

a programmable logic array (PLA) including a memory and a macro-architecture circuit for providing control signals;

a transceiver circuit coupled to said PLA for receiving said control signals and also coupled to said plurality of channels, said transceiver circuit comprising for each channel:

(a) a latch to receive and store an input to said channel;

(b) a first multiplexer coupled to receive latched outputs from said latches of other said channels, such that one of said other latched outputs is selected;

(c) a driver coupled to receive said selected output from said first multiplexer and coupled to transmit said selected output onto said channel;

wherein for each said channel, its input is latched and coupled to various said first multiplexers of other said channels for switching its input onto other said channels;

whereby data on each of said channels is switched for transmission onto other said channels.

2. The EPLD of claim 1, wherein said control signals from said PLA provide for latching each of said channel inputs through its latch;

provide selecting of latched outputs from said first multiplexer;

and activates said drivers for transmission.

3. The EPLD of claim 1, further including for each channel, a second multiplexer coupled between said first multiplexer and said driver for selecting either a non-inverted or an inverted output of said first multiplexer.

4. The EPLD of claim 3, further including a feedback multiplexer, wherein said latched outputs of each channel are coupled as inputs to said feedback multiplexer, such that said feedback multiplexer selects one of said latched outputs as a feedback signal to said PLA to determine next state generation of said control signals.

5. The EPLD of claim 4, wherein said control signals from said PLA provide control of said latches, multiplexers and activation of said drivers.

6. The EPLD of claim 5, further including a plurality of said transceiver circuits for simultaneous transfer of information when each said channel is comprised of a plurality of data lines.

7. The EPLD of claim 6, wherein said PLA is implemented using EPROM technology.

8. The EPLD of claim 7, being implemented on a single semiconductor chip.

9. The EPLD of claim 1, wherein at least one of said drivers has a programmable output impedance.

10. A multiple-port transceiver for receiving, switching and transmitting digital data among said ports, said transceiver being controlled by control signals from a programmable logic array (PLA) implemented using EPROM technology, comprising:

for each said port:
(a) input means to receive an input to said port;
(b) first multiplexer means coupled to receive output from said input means of other said ports, such that one of said output from other said input means is selected;
(c) driver means coupled to receive said selected output from said first multiplexer means and coupled to transmit said selected output onto said port;
wherein for each said port, its input is propagated to various said first multiplexer means of other said ports for switching its input onto other said ports;
whereby digital data on each of said ports is switched for transmission onto other said ports.

11. The transceiver of claim 10, further including for each channel, second multiplexer means coupled between said first multiplexer means and said driver means for selecting either a non-inverted or an inverted output of said first multiplexer means.

12. The transceiver of claim 11, further including feedback multiplexer means, wherein said inputs of each said port are coupled to said feedback multiplexer means such that said feedback multiplexer means select one of said inputs as a feedback signal to said PLA to determine next state generation of said control signals.

13. The transceiver of claim 12, wherein said control signals from said PLA provide control of said input means, multiplexer means and activation of said driver means.

14. A three-port transceiver for receiving, switching and transmitting digital data among said ports, said transceiver being controlled by control signals from a programmable logic array (PLA) implemented using EPROM technology, comprising:

a first latch coupled to a first port for latching a first input signal present on said first port;
a second latch coupled to a second port for coupling a second input signal present on said second port;
a third latch coupled to a third port for latching a third input signal present on said third port;
a first multiplexer coupled to said second and third latches for receiving said second and third input signals and selecting one of said second and third input signals as an output of said first multiplexer;
a first driver coupled to said first multiplexer for driving said first multiplexer output onto said first port, such that one of said second or third input signals is switched onto said first port;
a second multiplexer coupled to said first and third latches for receiving said first and third input signals and selecting one of said first and third input signals as an output of said second multiplexer;
a second driver coupled to said second multiplexer for driving said second multiplexer output onto said second port, such that one of said second or third input signals is switched onto said second port;
a third multiplexer coupled to said first and second latches for receiving said first and second input signals and selecting one of said first and second input signals as an output of said third multiplexer;
a third driver coupled to said third multiplexer for driving said third multiplexer output onto said third port, such that one of said first or second input signals is switched onto said first port;
wherein for each said port, its input is latched to said multiplexers of other said ports for switching its input onto other said ports;
whereby digital data on each of said ports is switched for transmission onto other said ports.

15. The tri-port transceiver of claim 14, further including:
a fourth multiplexer coupled between said first multiplexer and said first driver for selecting either a non-inverted or an inverted output of said first multiplexer;
a fifth multiplexer coupled between said second multiplexer and said second driver for selecting either a non-inverted or an inverted output of said second multiplexer;
a sixth multiplexer coupled between said third multiplexer and said third driver for selecting either a non-inverted or an inverted output of said third multiplexer.

16. The tri-port transceiver of claim 15, further including a seventh multiplexer coupled to said first, second and third latches for selecting one of said input signals as an output of said seventh multiplexer, such that said seventh multiplexer provides a feedback signal to said PLA to determine next state generation of said control signals.

17. The tri-port transceiver of claim 16, wherein said first, second and third drivers are three-state drivers having a high impedance third-state when each of said drivers is made inactive.

18. The tri-port transceiver of claim 17, wherein said control signals from said PLA provide control of said latches, multiplexers and activation of said drivers.

19. The tri-port transceiver of claim 18, further including a first, second and third buffers, each said buffer being coupled between each of said port and its respective latch for buffering said respective input.

20. The tri-port transceiver of claim 19, further including an eighth and ninth multiplexer;
said eighth multiplexer coupled to select either a latched or an unlatched first input signal as an input to said second multiplexer;
said ninth multiplexer coupled to select either a latched or an unlatched second input signal as an input to said first multiplexer;

21. The tri-port transceiver of claim 19, being implemented on a single semiconductor chip.

22. The tri-port transceiver of claim 16, wherein any of said first, second and third drivers is a three-state driver having a programmable output impedance.

* * * * *